(12) United States Patent
Arena

(10) Patent No.: US 9,048,169 B2
(45) Date of Patent: Jun. 2, 2015

(54) FORMATION OF SUBSTANTIALLY PIT FREE INDIUM GALLIUM NITRIDE

(75) Inventor: Chantal Arena, Mesa, AZ (US)

(73) Assignee: SOITEC, Bernin (FR)

( * ) Notice: Subject to any disclaimer, the term of this patent is extended or adjusted under 35 U.S.C. 154(b) by 307 days.

(21) Appl. No.: 12/935,857

(22) PCT Filed: May 22, 2009

(86) PCT No.: PCT/IB2009/005716
§ 371 (c)(1),
(2), (4) Date: Sep. 30, 2010

(87) PCT Pub. No.: WO2009/141724
PCT Pub. Date: Nov. 26, 2009

(65) Prior Publication Data
US 2011/0057294 A1    Mar. 10, 2011

Related U.S. Application Data

(60) Provisional application No. 61/055,893, filed on May 23, 2008.

(51) Int. Cl.
| | |
|---|---|
| H01L 21/30 | (2006.01) |
| H01L 21/46 | (2006.01) |
| H01L 21/18 | (2006.01) |
| H01L 31/0304 | (2006.01) |
| H01L 31/18 | (2006.01) |
| H01L 33/00 | (2010.01) |
| H01L 33/16 | (2010.01) |

(52) U.S. Cl.
CPC .......... *H01L 21/187* (2013.01); *H01L 31/0304* (2013.01); *H01L 31/184* (2013.01); *H01L 33/0079* (2013.01); *H01L 33/16* (2013.01); *Y02E 10/544* (2013.01)

(58) Field of Classification Search
USPC .................................. 438/455; 257/E21.088
See application file for complete search history.

(56) References Cited

U.S. PATENT DOCUMENTS

| | | |
|---|---|---|
| 6,194,742 B1 | 2/2001 | Kern et al. |
| 6,281,032 B1 | 8/2001 | Matsuda et al. |
| 6,441,393 B2 | 8/2002 | Goetz et al. |
| 6,559,075 B1 | 5/2003 | Kelly et al. |
| 6,815,309 B2 | 11/2004 | Letertre et al. |

(Continued)

FOREIGN PATENT DOCUMENTS

| | | |
|---|---|---|
| CA | 2669228 | 5/2008 |
| EP | 1467404 A2 | 10/2004 |

(Continued)

OTHER PUBLICATIONS

Mastro et al., Influence of Polarity on GaN Thermal Stability, Journal of Crystal Growth, vol. 274 (2005) pp. 38-46.

(Continued)

*Primary Examiner* — Hsin-Yi Hsieh
(74) *Attorney, Agent, or Firm* — TraskBritt

(57) ABSTRACT

A method of fabricating a device layer structure includes providing a III-nitride semiconductor layer which is bonded to a bonding substrate. A device layer structure is formed on a nitrogen polar surface of the III-nitride semiconductor layer. The device layer structure includes an indium gallium nitride layer with a metal polar surface adjacent to the nitrogen polar surface of the III-nitride semiconductor layer.

10 Claims, 7 Drawing Sheets

(56) References Cited

U.S. PATENT DOCUMENTS

| | | | |
|---|---|---|---|
| 6,900,070 | B2 | 5/2005 | Craven et al. |
| 6,908,828 | B2 | 6/2005 | Letertre et al. |
| 6,953,736 | B2 | 10/2005 | Ghyselen et al. |
| 7,566,580 | B2 | 7/2009 | Keller et al. |
| 2006/0033120 | A1* | 2/2006 | Hon et al. ............ 257/103 |
| 2006/0076559 | A1 | 4/2006 | Faure et al. |
| 2006/0099776 | A1 | 5/2006 | Dupont |
| 2006/0100513 | A1 | 5/2006 | Hashimoto |
| 2006/0108603 | A1* | 5/2006 | Uemura et al. ............ 257/194 |
| 2006/0118513 | A1 | 6/2006 | Faure et al. |
| 2006/0126688 | A1 | 6/2006 | Kneissl |
| 2006/0202215 | A1 | 9/2006 | Wierer et al. |
| 2007/0072324 | A1 | 3/2007 | Krames et al. |
| 2007/0218703 | A1 | 9/2007 | Kaeding et al. |
| 2008/0111144 | A1 | 5/2008 | Fichtenbaum et al. |
| 2008/0113496 | A1 | 5/2008 | Keller et al. |
| 2008/0237640 | A1 | 10/2008 | Mishra et al. |
| 2008/0277682 | A1 | 11/2008 | Mishra et al. |
| 2009/0085065 | A1 | 4/2009 | Mishra et al. |
| 2009/0218599 | A1 | 9/2009 | Mishra et al. |
| 2009/0246944 | A1 | 10/2009 | Keller et al. |

FOREIGN PATENT DOCUMENTS

| | | |
|---|---|---|
| EP | 1837922 A1 | 9/2007 |
| JP | 2010509177 | 3/2010 |
| JP | 2010510655 | 4/2010 |
| JP | 2010523006 | 7/2010 |
| WO | 2007063920 | 6/2007 |
| WO | WO2008060349 | 5/2008 |
| WO | WO2008060531 | 5/2008 |
| WO | WO2008121976 | 10/2008 |

OTHER PUBLICATIONS

Zheleva et al., Pendeo-Epitaxy: A New Approach for Lateral Growth of Gallium Nitride Films, MRS Internet Journal of Nitride Semiconductor Research, 4S1(G3.38). Journal of Electronic Materials, vol. 28, No. 4 (1999) pp. L5-L8.

Keller et al., Growth and Characterization of N-Polar InGaN/GaN Multiquantum Wells, Applied Physics Letters 90, 191908 (2007).

Nam et al., Lateral Epitaxy of Low Defect Density GaN Layers bia Organometallic Vapor Phase Epitaxy, Applied Physics Letters, Nov. 1997;71(18):2638-2640.

Kuramoto et al., Room-Temperature Continuous-Wave Operation of InGaN Multi-Wuantum-Well Laser Diodes Grown on an n:GaN Substrate with a Backside n-Contact, Japanese Journal of Applied Physics, 1999;38:L 184-L186.

Gehrke et al., Pendeo-Epitaxy of Gallium Nitride and Aluminum Nitride Films and Heterostructures on Silicon Carbide Substrate, Mat. Res. Soc. Symp. Proc. vol. 537 (1999).

Reed et al., Growth and Characterization of Single-Crystalline Gallium Nitride Using (100) LiAIO2 Subtrates, Journal of Crystal Growth, 2005;274:14-20.

Mastro et al., Thermal Stability of MOCVD and HVPE GaN Layers in H2, HCl, NH3 and N2, Phys. Stat. Sol. 2001;188(1):467-471.

International Search Report Search Report for International Application No. PCT/IB2009/005716 mailed Aug. 13, 2009, 4 pages.

International Preliminary Report on Patentability and Written Opinion for International Application No. PCT/IB2009/005716 dated Nov. 23, 2010, 7 pages.

Kelly et al., Optical Process for Liftoff of Group III-Nitride Films, Physica Status Solidi A 159, R3 (1997).

* cited by examiner

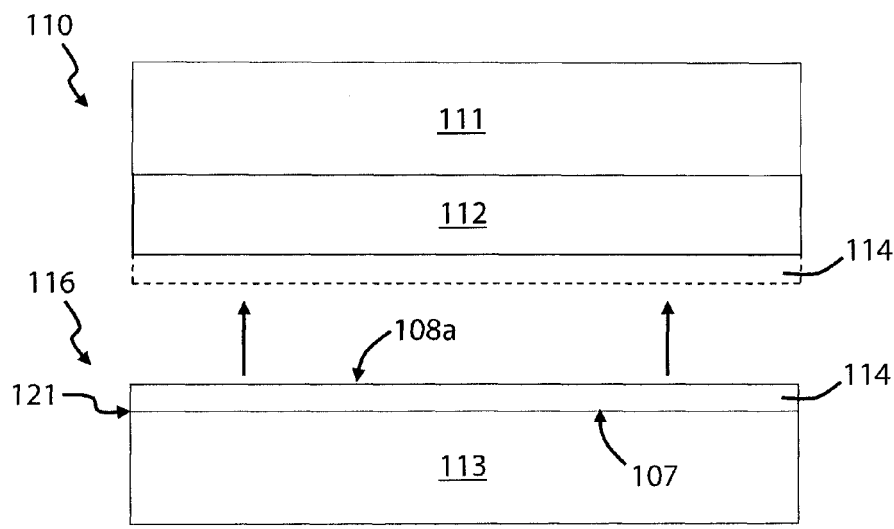
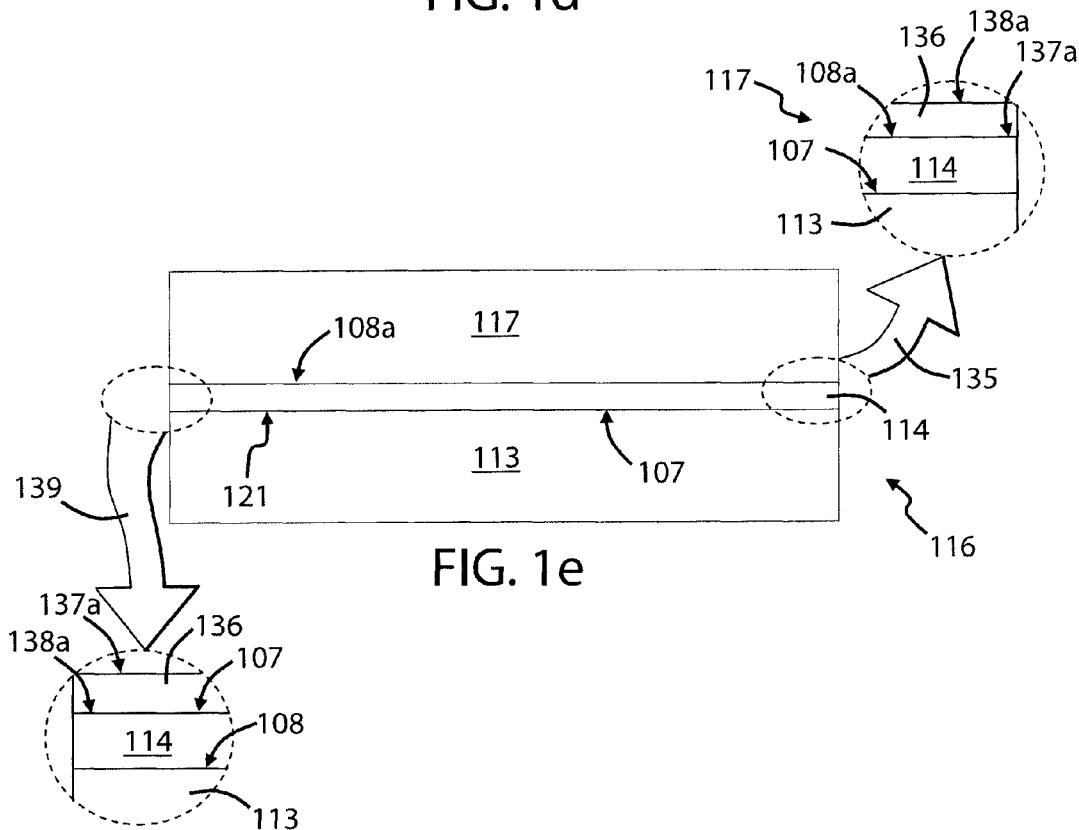
FIG. 1d
FIG. 1e

FORMATION OF SUBSTANTIALLY PIT FREE INDIUM GALLIUM NITRIDE

CROSS-REFERENCE TO RELATED APPLICATIONS

This is a national phase entry under 35 U.S.C. §371 of International Patent Application PCT/IB2009/005716, filed May 22, 2009, published in English as International Patent Publication WO 2009/141724 A1 on Nov. 26, 2009, which claims the benefit under 35 U.S.C. §119 of U.S. Provisional Patent Application Ser. No. 61/055,893, filed May 23, 2008, the entire disclosure of each of which is hereby incorporated herein by this reference.

TECHNICAL FIELD

This invention relates to growing indium gallium nitride and alloys thereof.

BACKGROUND

The alloy indium gallium nitride ($In_xGa_{1-x}N$) is part of the family of III-nitride materials, including for example, gallium nitride (GaN), aluminum nitride (AlN), indium nitride (InN) and alloys thereof. InGaN alloys can be used in an array of device structures, including, for example, electronic, optoelectronic, photovoltaic and microelectromechanical systems.

Layers of InGaN can include undesirable pits, which are commonly V-shaped. The pits generally develop at locations at which a defect, such as a threading dislocation, intercepts a GaN/InGaN interface. The V-shaped pits typically grow in size dependent on the thickness of the InGaN layer and can extend through the entire thickness of the InGaN layer. For example, a V-shaped pit can extend through the entire active region of a light-emitting device, such as a light-emitting diode or laser diode. In some instances, the light-emitting device may be rendered inoperable because a V-shaped pit allows the electrical contacts of a device structure to short circuit one another. Hence, it is desirable to form indium gallium nitride layers that have fewer pits.

As discussed in more detail in Applied Physics Letters 90, 191908 2007, Keller et al. noted a reduction in the size of V-shaped pits when N-polar InGaN layers are formed on N-polar GaN layers. Further, Keller et al. found that a higher percentage of indium atoms can be incorporated with N-polar InGaN layers for a given set of growth parameters, for example, for a given growth temperature.

However, Keller et al. formed N-polar gallium nitride layers by direct growth on a growth substrate (e.g., a sapphire substrate). Such direct growth of N-polar GaN films can involve complex processes, which may produce highly dislocated GaN material with undesirable surface roughness. The growth of N-polar InGaN layers on such poor quality highly dislocated GaN material may in turn also be highly dislocated and therefore can be less attractive for use in state of the art semiconductor devices.

BRIEF SUMMARY

The various embodiments of the present invention generally provide methods and structures for the fabrication of semiconductor structures comprising indium gallium nitride (InGaN). The methods are now briefly described in terms of certain embodiments of the invention. This summary is provided to introduce a selection of concepts in a simplified form that are further described in the detailed description of the embodiments of the invention. This summary is not intended to identify key features or essential features of the claimed subject matter, nor is it intended to be used to limit the scope of the claimed subject matter.

The embodiments of the invention are concerned with the formation of semiconductor structures, such structures comprising a bonding substrate and a III-nitride semiconductor layer bonded to the bonding substrate through a bonding interface, the III-nitride semiconductor layer having a metal polar surface proximate to the bonding substrate. The semiconductor structure may also include a device layer structure having an indium gallium nitride layer with a metal polar surface positioned adjacent to a nitrogen polar surface of the III-nitride semiconductor layer.

In further embodiments, the III-nitride semiconductor layer comprises a metal polarity grown III-nitride semiconductor material and in certain embodiments the metal polarity grown III-nitride semiconductor material comprises gallium polarity grown gallium nitride. The bonding interface is adjacent to the metal polar surface of the III-nitride semiconductor layer and the III-nitride semiconductor layer comprises a blanket layer of material, which comprises a seed layer.

The embodiments of the invention are also concerned with methods for fabricating a device layer structure, such methods comprising, providing a III-nitride semiconductor layer carried by a growth substrate. The semiconductor layer has a nitrogen polar surface proximate to the growth substrate. The III-nitride semiconductor layer is bonded to a first bonding substrate, wherein the semiconductor layer has a metal polar surface proximate to the first bonding substrate.

Additional embodiments of the invention comprise removing the growth substrate so the III-nitride semiconductor layer is carried by the first bonding substrate and forming a device layer structure on the III-nitride semiconductor layer. The device layer structure may include an indium gallium nitride layer having a metal polar surface proximate to the nitrogen polar surface of the III-nitride semiconductor layer. The indium gallium nitride layer may include a metal polar surface adjacent to the nitrogen polar surface of the III-nitride semiconductor layer.

In further embodiments of the invention, the solubility of indium in the indium gallium nitride layer is increased in response to forming the indium gallium nitride layer on the nitrogen polar surface. In addition, the size of a plurality of pits of the indium gallium nitride layer is reduced in response to forming the indium gallium nitride layer on the nitrogen polar surface.

In further embodiments of the invention, the step of removing the growth substrate includes removing a portion of the III-nitride material and may further include bonding the device layer structure to a second bonding substrate and removing the first bonding substrate from the III-nitride semiconductor material.

The method of fabricating the device layer structure includes further reducing the defect density of the III-nitride semiconductor layer proximate to the nitrogen polar surface utilizing at least one of wet and mechanical etching to reduce the defect density.

BRIEF DESCRIPTION OF THE DRAWINGS

FIGS. 1a through 1e are side views of steps in one embodiment of fabricating a device layer structure, in accordance with the invention.

DETAILED DESCRIPTION OF THE INVENTION

The invention involves reducing the number and size of pits typically formed when growing layers of indium gallium nitride (InGaN), as well as alloys thereof. The pits can have many different shapes, but they are often V-shaped pits. The shape of the pit commonly depends on the crystal structure of the material it extends through. For example, III-nitride semiconductor materials commonly have a wurtzite crystal structure, so the pits are typically V-shaped. Reducing the number of pits is useful because it allows for higher performance and more reliable semiconductor devices to be formed with the InGaN layer.

The invention also involves growing an InGaN layer so it can include a larger amount of indium, for example, by increasing the indium solubility of the InGaN layer. The indium solubility of the InGaN layer is dependent on a number of factors including its growth temperature and the surface polarity of the layer it is formed on. Increasing the amount of indium in the InGaN layer can be useful when it is used in a semiconductor device, for example, when it is desired to form optical semiconductor devices that emit light at longer wavelengths.

Various embodiments of the inventive method are useful in fabricating a wide variety of III-V semiconductor devices. The semiconductor devices can generally include optical devices, such as photodetectors, solar cells, lasers and light-emitting diodes, as well as non-optical devices, such as transistors. More information regarding optical semiconductor devices can be found in U.S. Patent Application Publication No. 2006/0126688, as well as the references cited therein.

Figure 1A:
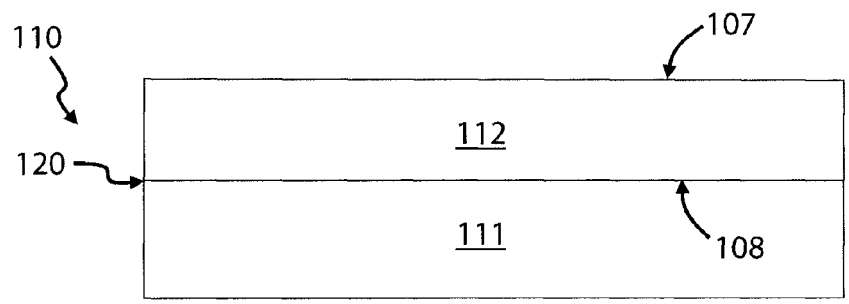

FIGS. 1a through 1e are sectional views of steps in one embodiment, in accordance with the invention, of fabricating a pseudo-donor substrate 100 (FIG. 1b), which can be used to form one or more pseudo-substrates 116 (FIG. 1d). Pseudo-substrate 116 is used as a composite substrate to form a device layer structure 117 (FIG. 1e). Device layer structure 117 includes a nitrogen polar grown indium gallium nitride layer that is of higher quality than those formed using other methods. The nitrogen polar grown indium gallium nitride layer is of higher quality because it has fewer threading dislocations and pits, and the pits tend to be smaller in size. In some embodiments, the indium gallium nitride layer included in device layer structure 117 can be an alloy of indium gallium nitride.

More information regarding steps in the inventive methods discussed herein can be found in U.S. Pat. Nos. 6,815,309, 6,908,828 and 6,953,736, as well as U.S. Patent Application Publication No. 2006/0099776, all of which are incorporated herein by reference. These references will be referred to as the '309, '828, '736 and '776 references, respectively.

In FIG. 1a, a semiconductor structure 110 is provided wherein structure 110 includes a growth substrate 111 and III-nitride semiconductor layer 112. In this embodiment, semiconductor layer 112 is carried by growth substrate 111 and includes metal polar surface 107 and non-metal polar surface 108. Metal polar surface 107 is positioned away from growth substrate 111 and non-metal polar surface 108 is positioned proximate to growth substrate 111. In general, the material included in growth substrate 111 allows III-nitride semiconductor layer 112 to be formed with a higher material quality. It is generally desirable for III-nitride semiconductor layer 112 to have a higher material quality so that a semiconductor layer with a higher material quality can be grown thereon. This is useful when III-nitride semiconductor layer 112 and the layer subsequently grown thereon are used to form semiconductor devices.

The material quality of a semiconductor layer can be determined, for example, by determining its surface roughness and defect density, as well as the number of threading dislocations and pits included therein. A semiconductor layer with a low surface roughness and/or defect density is generally of better material quality than a semiconductor layer with a high surface roughness and/or defect density. A semiconductor layer with fewer threading dislocations and pits is generally of better material quality than a semiconductor layer with more threading dislocations and pits. Further, a semiconductor layer with smaller-size pits is generally of better material quality than a semiconductor layer with larger-size pits.

The material quality of III-nitride semiconductor layer 112 can be determined using characterization techniques, such as X-ray diffraction (XRD) and scanning electron microscopy (SEM). In some embodiments, the quality of III-nitride semiconductor layer 112 can be increased by employing defect reduction growth techniques, such as epitaxial lateral overgrowth (ELO), facet-initiated epitaxial lateral overgrowth (FIELO), PENDEO epitaxy and in-situ masking. More information about these growth techniques can be found in Applied Physics Letters, Volume 71 (18) 2638 (1997)), Japanese Journal of Applied Physics, Volume 38, L184 (1999)), and Materials Research Society Internet Journal of Nitride Semiconductor Research 4S1, G3.38 (1999)).

A growth substrate is a substrate having a growth surface for forming one or more semiconductor layers thereon. III-nitride semiconductor layer 112 is grown on the growth surface of growth substrate 111 so that a growth interface 120 is formed between them. The semiconductor layers are generally formed by growth techniques, such as metallorganic chemical vapor deposition (MOCVD), molecular beam epitaxy (MBE) and hydride (or halide) vapor phase epitaxy (HVPE), among others. More information regarding MOCVD and HVPE can be found in U.S. Patent Application Publication Nos. 2006/0076559 and 2006/0118513, as well as in M. A. Mastro et al., "Influence of Polarity on GaN Thermal Stability," Journal of Crystal Growth, vol. 274, pp. 38-46 (2005) and M. A. Mastro et al., "Thermal Stability of MOCVD and HVPE GaN Layers in $H_2$, HCl, $NH_3$ and $N_2$," Physica Status Solidi (a), vol. 188, No. 1, pp. 467-471 (2001). The formation of a semiconductor is often referred to as deposition and growth.

Growth substrate 111 can include many materials, but the material chosen generally depends on the material included in the layers formed on it. For example, if the layer formed on growth substrate 111 includes gallium nitride, then growth substrate 111 generally includes silicon carbide, silicon or sapphire. More information regarding semiconductor substrates can be found in U.S. Pat. Nos. 6,194,742 and 6,441,393, as well as U.S. Patent Application Publication No. 2007/0072324.

Growth substrate 111 is shown as including a single layer of material for simplicity, but it can include one or more layers. Hence, growth substrate 111 can be homogeneous, wherein it includes the same material throughout, or it can be non-homogeneous (i.e., heterogeneous), wherein it includes different materials.

III-nitride semiconductor layer 112 can include gallium nitride, and can be grown so that metal polar surface 107 is a gallium polar surface and non-metal polar surface 108 is a nitrogen polar surface. Hence, III-nitride semiconductor layer 112 is formed so it has a desired surface polarity, wherein the surface polarity can be non-polar, semi-polar and polar. More information regarding semi-polar semiconductor materials is provided in U.S. Patent Application Publication No. 2007/0218703. Further, more information regarding non-polar semiconductor materials can be found in U.S. Pat. No. 6,900,070. In general, non-polar III-nitrides are grown on non-polar crystal planes, wherein the number of gallium and nitrogen atoms (in the case of gallium nitride) of the crystal plane are driven to equal each other so that the crystal plane is driven to be charge neutral. Further, semi-polar III-nitride planes include about the same number of gallium and nitrogen atoms and such planes are not necessarily charge neutral.

A polar III-nitride can have a metal polarity (e.g., gallium polar for gallium nitride) or a non-metal polarity (e.g., nitrogen polar for gallium nitride) and is not charge neutral. In general, in wurtzite GaN (and many of the other III-nitrides) the gallium atoms are tetrahedrally coordinated to four nitrogen (N) atoms, but of these, it is strongly bonded only to the three nearest-neighbor nitrogen atoms. If the three strong bonds from a gallium atom to its three nearest-neighbor nitrogen atoms are directed downward toward growth substrate 111, the polarity is referred to as +c (also known as gallium polar or metal polar), wherein the label c refers to the crystal plane perpendicular to the plane of growth substrate 111. For the opposite polarity, which is denoted as −c (also known as nitrogen polar or non-metal polar), the direction of the gallium atom bonds to its three nearest-neighbor nitrogen atoms is directed upwards along the growth direction. The polar nature of the III-nitride materials is a bulk property and reference herein to the polarity of a "surface" is used to indicate the orientation of the polar crystal.

It is generally desirable to form semiconductor devices with a device layer structure formed on a metal polarity surface because their performance is typically better. Hence, III-nitride semiconductor layer 112 is often formed so it has an exposed metal polar surface instead of an exposed non-metal polar surface. This is because, as discussed in more detail below, the surface polarity of III-nitride semiconductor layer 112 is chosen to reduce its defect density, such as the number of threading dislocations which extend through it. III-nitride semiconductor layer 112 has a reduced defect density when it is formed so its exposed surface is a metal polar surface. The surface polarity of III-nitride semiconductor layer 112 is also chosen to increase its material quality.

In this embodiment, semiconductor layer 112 is formed so the material included therein has a non-metal polarity proximate to surface 108 and a metal polarity proximate to surface 107. Hence, surface 108 is a non-metal polar surface and is positioned proximate to growth substrate 111, and surface 107 is a metal polar surface and is positioned away from growth substrate 111. Surface 108 is adjacent to growth interface 120 and surface 107 is away from growth interface 120. In this way, III-nitride semiconductor layer 112 includes metal polarity grown III-nitride semiconductor material.

Figure 1B:
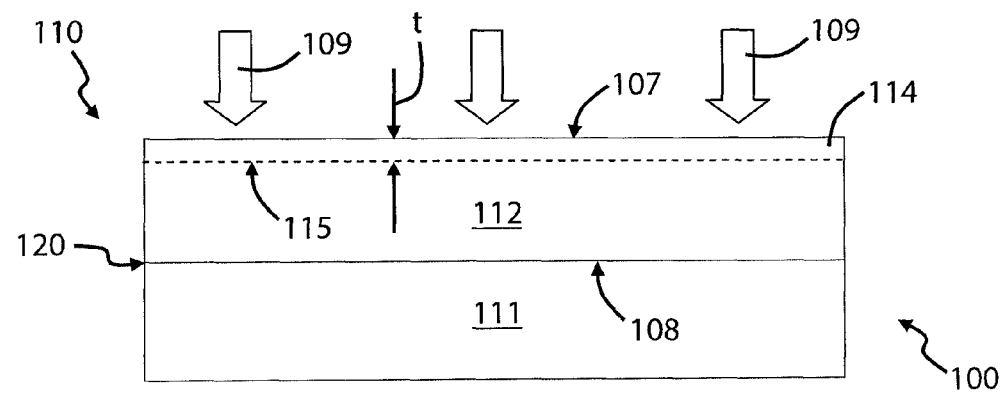

In FIG. 1b, a chemical species 109 is introduced, using ion implantation, into III-nitride semiconductor layer 112 to form an implanted layer 115 and seed layer 114. In this embodiment, pseudo-donor substrate 100 includes growth substrate 111, as well as III-nitride semiconductor layer 112 and seed layer 114. Chemical species 109 is introduced into III-nitride semiconductor layer 112 so that implanted layer 115 extends through it. Implanted layer 115 is often referred to as a zone of weakness because its mechanical strength is reduced relative to the material around it in response to the introduction of chemical species 109. In this embodiment, chemical species 109 is implanted through metal polar surface 107 and toward non-metal polar surface 108 so that implanted layer 115 is between non-metal polar surface 108 and metal polar surface 107. Further, chemical species 109 is implanted through metal polar surface 107 and toward growth interface 120 so that implanted layer 115 is between non-metal polar surface 108 and growth interface 120.

Chemical species 109 can be of many different types, such as hydrogen. The process of using chemical species 109 to form implanted layer 115 is often referred to as SMART-CUT® and more information regarding it can be found in the '309, '828, '736 and '776 references, as well as in U.S. Patent Application Publication No. 2006/0100513. The positioning of chemical species 109 in seed layer 114 can be controlled, such as by controlling its dose, implantation energy, and implantation angle.

Seed layer 114 is formed with III-nitride semiconductor layer 112 in response to the formation of implanted layer 115. Seed layer 114 includes the portion of III-nitride semiconductor layer 112 between implanted layer 115 and metal polar surface 107. Hence, seed layer 114 is formed in response to forming implanted layer 115. Implanted layer 115 extends through semiconductor layer 112 between surfaces 107 and 108 and is positioned a distance t away from surface 107, wherein distance t corresponds to the thickness of seed layer 114. Distance t typically varies along surface 107, but it is shown in FIG. 1b as being constant for illustrative purposes.

In some embodiments, the exposed surface of semiconductor layer 112 can be processed after chemical species 109 is implanted therein. For example, semiconductor layer 112 can be cleaned to remove contaminants and its surface roughness can be reduced by wet and/or mechanical etching. Wet etching involves etching using chemicals, and mechanical etching involves etching using a mechanical system, such as a chemical mechanical polisher. There are many different types of mechanical etching, such as grinding, lapping and chemical mechanical polishing.

Figure 1C:
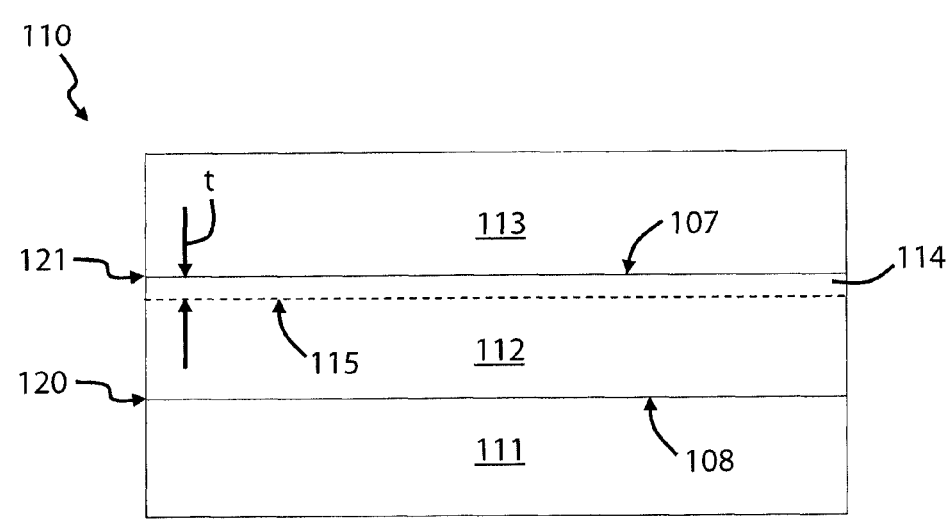

In FIG. 1c, a bonding substrate 113 is provided and bonded to III-nitride semiconductor layer 112. In particular, bonding substrate 113 is bonded to seed layer 114. Bonding substrate 113 is bonded to III-nitride semiconductor layer 112 at metal polar surface 107 to form a bonding interface 121. Bonding substrate 113 is bonded to III-nitride semiconductor layer 112 through bonding interface 121. Bonding interface 121 extends between III-nitride semiconductor layer 112 and bonding substrate 113. Bonding interface 121 is positioned proximate to metal polar surface 107 and away from growth interface 120 and non-metal polar surface 108. Further, bonding interface 121 is away from implanted layer 115 by distance t.

In this embodiment, metal polar surface 107 is proximate to bonding substrate 113 and non-metal polar surface 108 is away from bonding substrate 113. Further, bonding interface 121 is proximate to metal polar surface 107 and is away from non-metal polar surface 108. Further, implanted layer 115 and seed layer 114 are positioned between bonding interface 121 and growth interface 120. Implanted layer 115 and seed layer 114 are positioned between metal polar surface 107 and growth interface 120. The defect density of III-nitride semiconductor layer 112 is generally larger proximate to growth interface 120 than bonding interface 121. Further, the material quality of III-nitride semiconductor layer 112 is greater proximate to bonding interface 121 than growth interface 120.

In some embodiments, bonding substrate 113 is homogeneous wherein it includes a single type of material (e.g., sapphire) and, in other embodiments, bonding substrate 113 is heterogeneous wherein it includes more than one type of material (e.g. sapphire-on-aluminum nitride, for example). Further, in some embodiments, bonding substrate 113 can include one or more dielectric layers, such as silicon oxide and silicon nitride, positioned adjacent to bonding interface 121. In general, the dielectric bonding material included in bonding substrate 113 is chosen to facilitate the bonding between III-nitride semiconductor layer 112 and bonding substrate 113. Hence, the dielectric bonding layer is positioned so that it is adjacent to and bonds with III-nitride semiconductor layer 112. The dielectric bonding layer bonds to metal polar surface 107 so bonding interface 121 is formed between them.

Bonding interface 121 is generally formed by applying heat to metal polar surface 107 and bonding substrate 113 to increase the bond strength between them. The bond strength can be further increased by using one or more pre-bonding processing steps, such as chemically cleaning surface 107 to remove contaminants therefrom. For example, metal polar surface 107 can be chemically cleaned with a plasma prior to the formation of bonding interface 121.

In FIG. 1d, energy is applied to implanted layer 115 so that seed layer 114 is separated from III-nitride semiconductor layer 112 and is carried by bonding substrate 113. Seed layer 114 can be separated from III-nitride semiconductor layer 112, such as by methods discussed in the '309, '828, '736 and '776 references mentioned above. Seed layer 114 and bonding substrate 113 form pseudo-substrate 116. An exposed surface 108a of seed layer 114 is a nitrogen polar surface. As discussed in more detail above, it is generally more desirable to form device layer structure 117 on a non-metal polar surface, such as a nitrogen polar surface, because structure 117 includes a layer of indium gallium nitride, or an alloy thereof, adjacent to seed layer 114.

III-nitride semiconductor layer 112, as shown in FIG. 1d, can be implanted again, as shown in FIG. 1b, and the steps in FIGS. 1b, 1c and 1d can be repeated to form a number of pseudo-substrates 116 (FIG. 1d) on which device layer structures 117 (FIG. 1e) are formed. In general, the steps shown in FIGS. 1b, 1c and 1d can be repeated until growth substrate 111 has been exposed. In this way, a number of pseudo-substrates are formed.

III-nitride semiconductor layer 112 can be regrown after it, or a portion of it, has been transferred from growth substrate 111 to bonding substrate 113 as seed layer 114. In this way, III-nitride semiconductor layer 112 is replenished, which reduces costs because more pseudo-substrates can be formed in fewer steps and less time. By regrowing III-nitride semiconductor layer 112, the steps shown in FIGS. 1b, 1c and 1d can be repeated many more times.

In FIG. 1e, device layer structure 117 is formed on pseudo-substrate 116. In particular, device layer structure 117 is formed on nitrogen polar surface 108a of seed layer 114. Device layer structure 117 generally includes one or more alloys of the material of seed layer 114. In this embodiment, device layer structure 117 includes one or more layers of InGaN, or an alloy thereof, wherein a layer of InGaN is grown on non-metal polar surface 108a of seed layer 114. In this way, device layer structure 117 includes InGaN material formed on a nitrogen polar surface.

Further, in accordance with the invention, the InGaN material grown on non-metal polar surface 108a is nitrogen polar grown InGaN material, as indicated by an indication arrow 135. The indium gallium nitride layer is denoted as layer 136 and the metal and non-metal polar surfaces of indium gallium nitride layer 136 are denoted as surfaces 137a and 138a, respectively. Metal polar surface 137a is positioned adjacent to non-metal polar surface 108a and non-metal polar surface 138a is positioned away from non-metal polar surface 108a. Hence, InGaN layer 136 includes nitrogen polar grown InGaN material because it is grown so that non-metal polar surface 138a is a nitrogen polar surface.

InGaN layer 136 has a higher material quality because it is grown on seed layer 114, which includes gallium polarity grown gallium nitride material. As mentioned above, gallium polarity grown gallium nitride material has a higher material quality than nitrogen polarity grown gallium nitride material. Hence, InGaN layer 136 will have higher quality InGaN material because it is grown on higher quality gallium nitride material.

In particular, gallium polarity grown gallium nitride material may have fewer threading dislocations than nitrogen polarity grown gallium nitride material. Hence, InGaN layer 136 may have fewer threading dislocations because it is grown on a gallium nitride material, which has fewer threading dislocations. Gallium polarity grown gallium nitride material may have fewer pits than nitrogen polarity grown gallium nitride material because it has fewer threading dislocations. Hence, InGaN layer 136 may have fewer pits because it is grown on a gallium nitride material which has fewer pits.

Further, the solubility of indium in InGaN layer 136 is increased in response to forming layer 136 on non-metal polar surface 108a of seed layer 114. Also, the amount of indium in InGaN layer 136 can be distributed more uniformly throughout layer 136 in response to forming layer 136 on non-metal polar surface 108a of seed layer 114. It is believed that the surface energy of a nitrogen polar surface allows a larger amount of indium to be incorporated in an InGaN layer grown on it at a desired growth temperature. In this way, non-metal polar surface 108a increases the solubility of the indium in InGaN layer 136 at the desired temperature. This is useful so that the desired amount of indium can be incorporated into InGaN layer 136 at a lower growth temperature, thereby substantially preventing some layers of pseudo-substrate 116 from degrading due to high temperature exposure.

Being able to increase the amount of indium in InGaN layer 136 is useful when device layer structure 117 includes layers of indium gallium nitride with compositions greater than about 15% indium. In some optical semiconductor device applications, it is desirable to include indium gallium nitride layers in device layer structure 117, which have a composition of about $In_{0.15}Ga_{0.85}N$. Longer wavelengths of light can be emitted by device layer structure 117 when it includes layers of indium gallium nitride with compositions of about $In_{0.15}Ga_{0.85}N$. In some applications, it is desirable to have indium gallium nitride layers in device layer structure 117, which include more than about 20% indium (i.e., $In_{0.20}Ga_{0.80}N$).

Substitution arrow 139 of FIG. 1e shows an example wherein seed layer 114 includes non-metal polar surface 108 adjacent to bonding substrate 113 and metal polar surface 107 away from bonding substrate 113. In this example, InGaN layer 136 is grown on metal polar surface 107 of seed layer 114, wherein InGaN layer 136 is grown so that non-metal surface 138a is adjacent to metal polar surface 107 and metal polar surface 137a is away from metal polar surface 107. Hence, InGaN layer 136 includes metal polar grown indium gallium nitride material because it is grown so that metal polar surface 137a is a metal polar surface.

It is believed that the surface energy of a gallium polar surface restricts the amount of indium that can be incorporated in an InGaN layer grown on it at a desired growth temperature. Hence, by forming InGaN layer 136 as shown by indication arrow 135 rather than substitution arrow 139, the solubility of indium in InGaN layer 136 is increased and more indium can be incorporated into InGaN layer 136 at the desired temperature. Further, by forming InGaN layer 136 as shown by indication arrow 135 rather than substitution arrow 139, the material quality of indium in InGaN layer 136 is increased.

In some embodiments, device layer structure 117 includes a single layer of InGaN material that is grown pseudomorphically (i.e., below its critical thickness) so that the quality of the InGaN material is preserved. The quality of the InGaN material is preserved because by choosing its thickness to be below its critical thickness, the formation of defects and dislocations is less likely to occur because the InGaN crystal is less likely to strain relax via defect formation and/or phase separate. In other embodiments, device layer structure 117 includes a single layer of InGaN material, which is grown so its thickness is greater than its critical thickness. The material included in device layer structure 117 experiences strain relaxation when its thickness is greater than the critical thickness. Hence, device layer structure 117 can include a single layer of InGaN material that is strain relaxed or not strain relaxed.

Figure 2:
FIG. 2 is a perspective view of the semiconductor structure of FIG. 1e.

FIG. 2 is a perspective view of pseudo-substrate 116, in accordance with the invention, as shown in FIG. 1e. In this embodiment, bonding substrate 113 is a wafer and seed layer 114 and device layer structure 117 are blanket layers of material carried by bonding substrate 113.

Figure 3A:
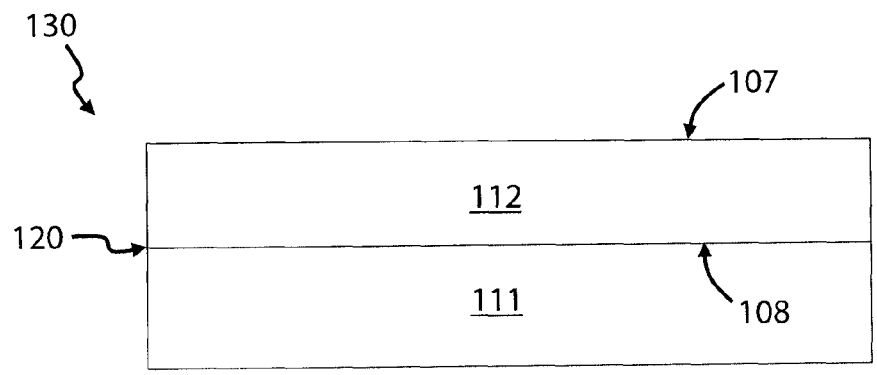
FIGS. 3a through 3d are side views of steps in another embodiment of fabricating a device layer structure, in accordance with the invention.
Figure 3B:
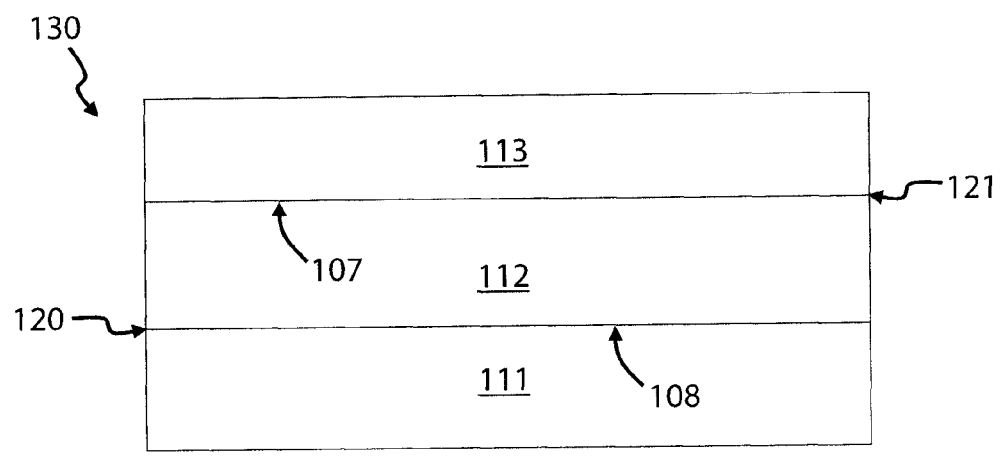
Figure 3C:
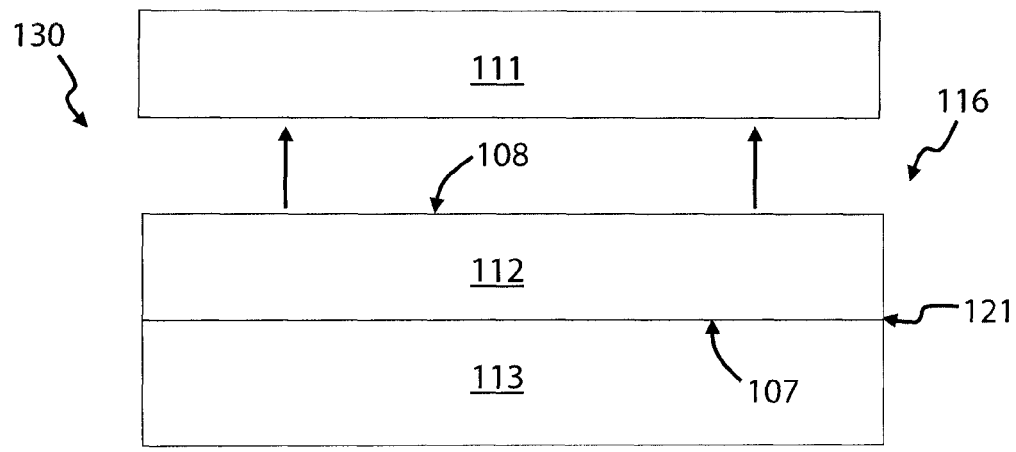
Figure 3D:
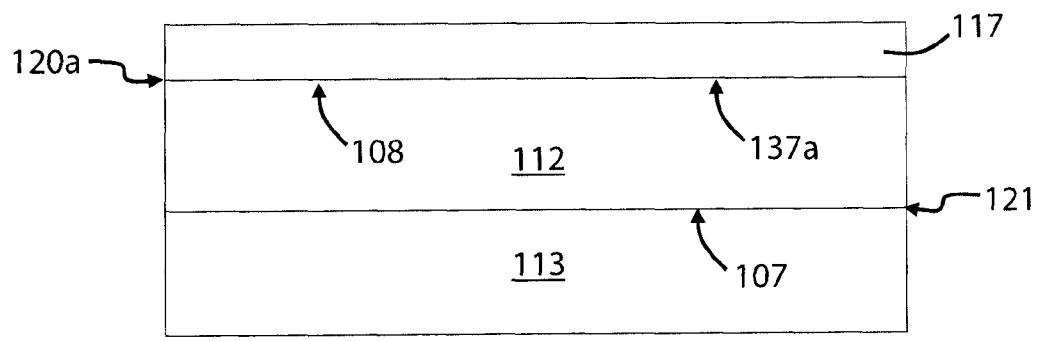

FIGS. 3a through 3d are sectional views of steps in another method, in accordance with the invention, of forming pseudo-substrate 116 (FIG. 3c). As mentioned above, pseudo-substrate 116 is used as a composite substrate to form device layer structure 117 (FIG. 3d).

In FIG. 3a, a semiconductor structure 130 is provided, wherein semiconductor structure 130 includes III-nitride semiconductor layer 112 and growth substrate 111. In this embodiment, III-nitride semiconductor layer 112 is carried by growth substrate 111 and growth interface 120 extends between them. Further, III-nitride semiconductor layer 112 includes gallium nitride, and surfaces 107 and 108 are gallium and nitrogen polar surfaces, respectively.

In FIG. 3b, bonding substrate 113 is bonded to III-nitride semiconductor layer 112. In particular, bonding substrate 113 is bonded to gallium polar surface 107 to form bonding interface 121 between them.

In FIG. 3c, growth substrate 111 is removed from III-nitride semiconductor layer 112 so that III-nitride semiconductor layer 112 is carried by bonding substrate 113 and nitrogen polar surface 108 is exposed. In this embodiment, III-nitride semiconductor layer 112 and bonding substrate 113 form pseudo-substrate 116. Growth substrate 111 can be removed from III-nitride semiconductor layer 112 in many different ways, such as by mechanical etching. As mentioned above, there are many different types of mechanical etching, such as grinding, lapping and chemical mechanical polishing. In this embodiment, however, laser lift-off (LLO) is used.

Laser lift-off is useful when the material included in III-nitride semiconductor layer 112 and growth substrate 111 absorbs different amounts of light at a given wavelength. For example, gallium nitride and sapphire absorb different amounts of light at a given wavelength. More information regarding laser lift-off can be found in U.S. Pat. No. 6,559,075 and Kelly et al., Physica Status Solidi A 159, R3 (1997). The use of laser lift-off is useful because growth substrate 111 can be reused, which reduces waste. A portion of III-nitride semiconductor layer 112 proximate to nitrogen polar surface 108 can be removed, if desired, to remove defects.

In FIG. 3d, device layer structure 117 is formed on III-nitride semiconductor layer 112, as described in more detail above with FIG. 1e. In this embodiment, device layer structure 117 is grown on nitrogen polar surface 108 so that a growth interface 120a is formed between them. Further, device layer structure 117 is grown so that it includes nitrogen polar indium gallium nitride material adjacent to nitrogen polar surface 108. Hence, device layer structure 117 includes metal polar surface 137a adjacent to nitrogen polar surface 108, as indicated by indication arrow 135 in FIG. 1e.

In some situations, it is desirable to change the surface polarity of the exposed surface of device layer structure 117, wherein the exposed surface is denoted as surface 117a and has a non-metal polarity for illustrative purposes. The polarity of the exposed surface of device layer structure 117 can be changed in many different ways, one of which will be discussed in more detail presently.

Figure 3E:
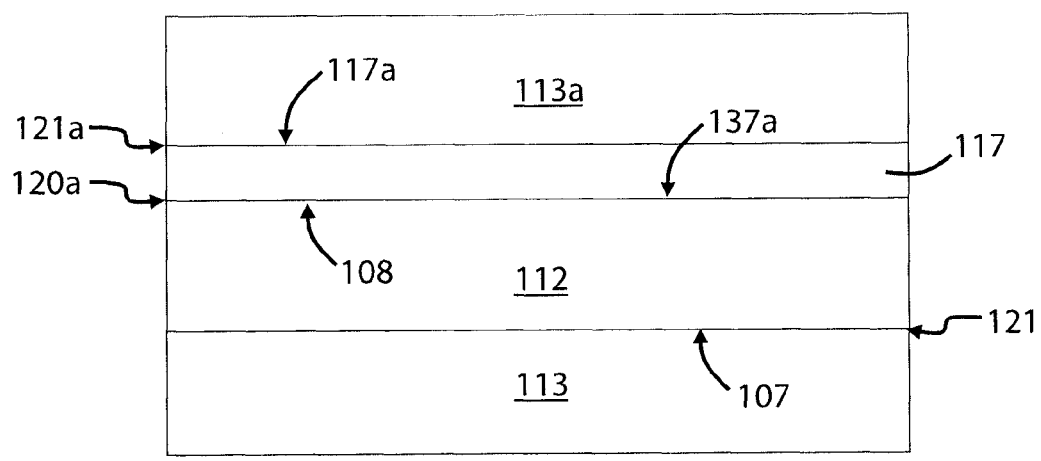
FIGS. 3e through 3g are side views of steps in a method of changing the surface polarity of the device layer structure of FIG. 3d.
Figure 3F:
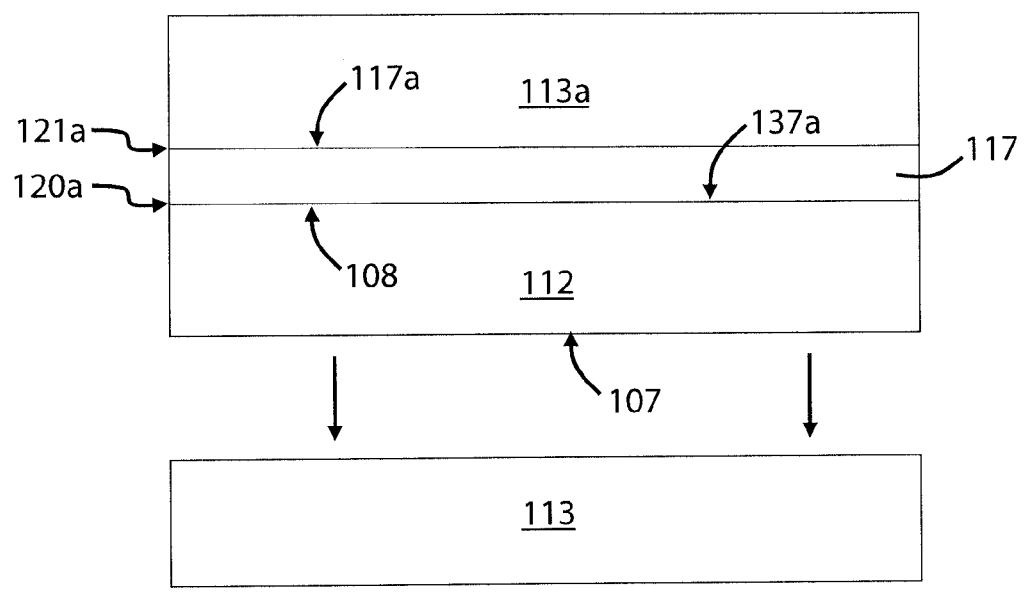
Figure 3G:
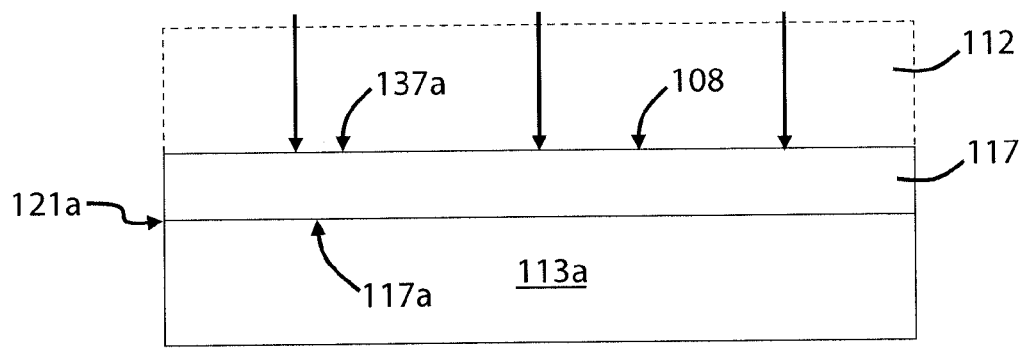

FIGS. 3e through 3g are side views of steps of changing the surface polarity of the exposed surface of device layer structure 117 as shown in FIG. 3d. The steps shown in FIGS. 3e through 3g can also be used to change the surface polarity of the exposed surface of device layer structure 117 as shown in FIG. 1e.

In FIG. 3e, a bonding substrate 113a is provided and bonded to device layer structure 117 to form a bonding interface 121a. In this embodiment, bonding substrate 113a is bonded to device layer structure 117 at non-metal polar surface 117a, which is opposed to growth interface 120a and metal polar surface 137a.

In FIG. 3f, bonding substrate 113 and III-nitride semiconductor layer 112 are separated from each other so that device layer structure 117 and III-nitride semiconductor layer 112 are carried by bonding substrate 113a. Bonding substrate 113 and III-nitride semiconductor layer 112 can be separated from each other in many different ways, such as by using ion implantation, chemical and/or mechanical etching and laser lift-off. In this embodiment, laser lift-off is used by applying energy from a laser to bonding interface 121 (FIG. 3e), wherein bonding interface 121 extends between III-nitride semiconductor layer 112 and bonding substrate 113.

In FIG. 3g, III-nitride semiconductor layer 112, which is shown in phantom, is removed from device layer structure 117. III-nitride semiconductor layer 112 can be removed from device layer structure 117 in many different ways, such as by dry etching and wet etching. III-nitride semiconductor layer 112 can also be mechanically removed from device layer structure 117, such as by using mechanical etching. Metal polar surface 137a of device layer structure 117 is exposed in response to removing III-nitride semiconductor layer 112 from device layer structure 117. In this way, the surface polarity of the exposed surface of device layer structure 117 is changed from non-metal polar (FIG. 3d) to metal polar. If desired, surface 108 can be processed by cleaning it. Surface 108 can also be processed by reducing its surface roughness. Further, device layer structure 117 can be processed to form one or more semiconductor devices therewith.

Several examples of the steps of FIGS. 3a through 3d are now presented to illustrate one or more features of the method of the invention. The layers in these examples can be formed using the growth techniques described above, such as MOCVD, HVPE and MBE. Further, the layers can be processed, such as by using the etching techniques described above, and the layers can be heated to provide the layers with desired material properties, such as conductivity type.

These examples generally include one or more etching steps, which can include chemical and/or mechanical etching. The chemical used to chemically etch a layer generally depends on the material included therein. Some chemicals include those commonly used in semiconductor device processing, such as KOH, TMAH and $HF/HNO_3$, among others.

Further, these examples generally include one or more bonding steps, which involve heating the layers to elevated temperatures, such as during growth or wafer bonding. The layers can be cleaned before they are bonded so that the bond is stronger. The layers can also be lapped or polished to provide them with a desired thickness, such as a thickness below a critical thickness. The layers can also be lapped or polished to reduce their surface roughness.

Example 1

In this example, and as shown in FIG. 3a, III-nitride semiconductor layer 112 includes gallium nitride and is grown on growth substrate 111, which includes sapphire. Surface 107 is a gallium polar surface and surface 108 is a nitrogen polar surface.

Bonding substrate 113, as shown in FIG. 3b, includes sapphire and it is bonded to surface 107 to form bonding interface between them. Growth substrate 111 is removed from III-nitride semiconductor layer 112, as shown in FIG. 3c, using laser lift-off. After growth substrate 111 is removed, III-nitride semiconductor layer 112 is carried by bonding substrate 113.

Device layer structure 117 is formed on III-nitride semiconductor layer 112, as shown in FIG. 3d. In this example, device layer structure 117 includes a layer of N-polar indium gallium nitride positioned adjacent to nitrogen polar surface 108. Further, the composition of the material included in the indium gallium nitride layer is $In_xGa_{1-x}N$, wherein X is between about 0.05 and 0.15. In one particular example, X is equal to about 0.10.

Example 2

In this example, and as shown in FIG. 3a, III-nitride semiconductor layer 112 includes gallium nitride and is grown on growth substrate 111, which includes sapphire. Surface 107 is a gallium polar surface and surface 108 is a nitrogen polar surface.

Bonding substrate 113, as shown in FIG. 3b, includes sapphire and it is bonded to surface 107 to form bonding interface 121 between them. Growth substrate 111 is removed from III-nitride semiconductor layer 112, as shown in FIG. 3c, using laser lift-off. After growth substrate 111 is removed, III-nitride semiconductor layer 112 is carried by bonding substrate 113.

Device layer structure 117 is formed on III-nitride semiconductor layer 112, as shown in FIG. 3d. In this example, device layer structure 117 is a layer of N-polar indium gallium nitride, which is positioned adjacent to nitrogen polar surface 108. Further, the composition of the material included in the indium gallium nitride layer is $In_{0.10}Ga_{0.90}N$.

In this example, a second sapphire substrate is bonded to device layer structure 117 and bonding substrate 113 is removed from III-nitride semiconductor layer 112 using laser lift-off. Hence, III-nitride semiconductor layer 112 and device layer structure 117 are carried by the second sapphire substrate. III-nitride semiconductor layer 112 is removed from device layer structure 117 so that the Ga-polar surface of the indium gallium nitride layer is exposed. III-nitride semiconductor layer 112 can be removed from device layer structure 117 in many different ways, such as by wet and dry etching. Once III-nitride semiconductor layer 112 has been removed from the device layer structure 117, additional technological steps could be performed on surface 137a of the device layer structure 117 to treat the layer in preparation to receive additional deposition of growth layers, e.g., to form additional device layers. In this particular example, upon removal of III-nitride semiconductor layer 112, the device layer structure 117 is utilized as a seed layer for Ga-polar growth of a final device layer structure.

Figure 4A:
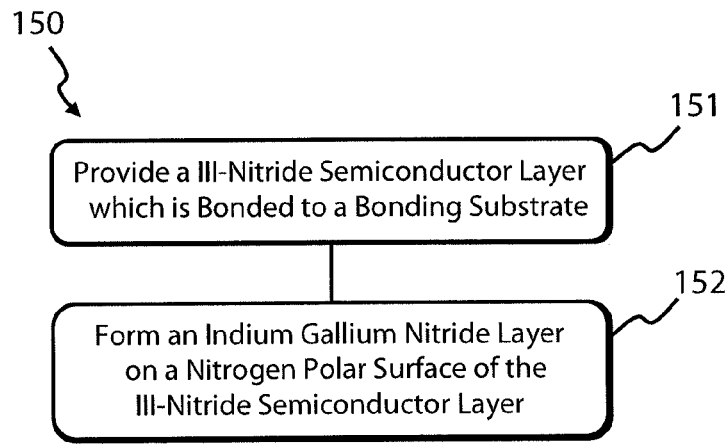
FIGS. 4a through 4c are flow diagrams of methods of fabricating a device layer structure, in accordance with the invention.

FIG. 4a is a flow diagram of a method 150, in accordance with the invention, of fabricating a device layer structure. In this embodiment, method 150 includes a step 151 of providing a III-nitride semiconductor layer, which is bonded to a bonding substrate. A bonding interface extends between the bonding substrate and III-nitride semiconductor layer. A first surface of the semiconductor layer is a nitrogen polar surface and the bonding interface is opposed to the nitrogen polar surface. The bonding interface is proximate to a second surface of the semiconductor layer, wherein the second surface is a gallium polar surface.

Method 150 includes a step 152 of forming an indium gallium nitride layer on the nitrogen polar surface, wherein the device layer structure includes the indium gallium nitride layer. In some embodiments, the indium gallium nitride layer has a metal polar surface proximate to the nitrogen polar surface of the III-nitride semiconductor layer.

Method 150 can include many other steps. For example, in some embodiments, step 151 can include forming the III-nitride semiconductor layer on a growth substrate so it has a second surface that is a gallium polar surface. In these embodiments, step 151 can include a step of bonding the second surface to the bonding substrate, and a step of removing the growth substrate so that III-nitride semiconductor layer is carried by the bonding substrate.

Figure 4B:
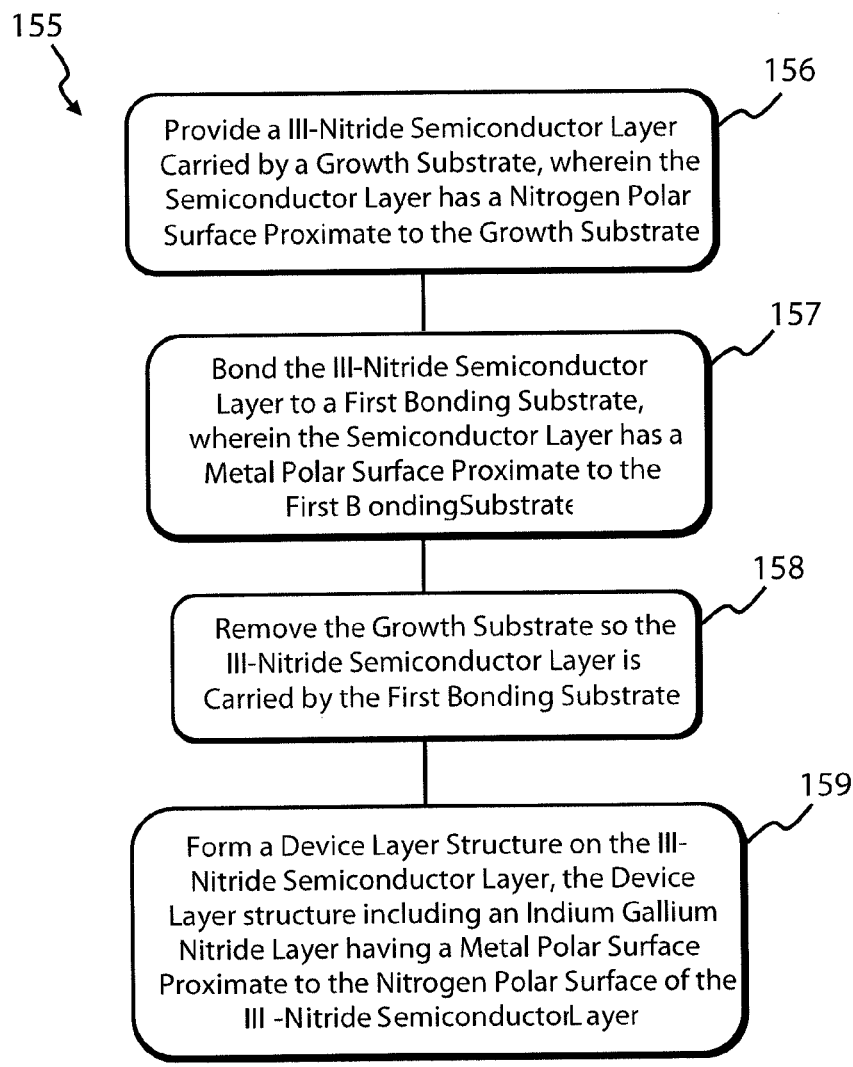

FIG. 4b is a flow diagram of a method 155, in accordance with the invention, of fabricating a device layer structure. In this embodiment, method 155 includes a step 156 of providing a III-nitride semiconductor layer carried by a growth substrate, wherein the semiconductor layer has a nitrogen polar surface proximate to the growth substrate. Method 155 includes a step 157 of bonding the III-nitride semiconductor layer to a first bonding substrate, wherein the semiconductor layer has a metal polar surface proximate to the first bonding substrate. A bonding interface extends between the III-nitride semiconductor layer and first bonding substrate.

Method 155 includes a step 158 of removing the growth substrate so the III-nitride semiconductor layer is carried by the first bonding substrate. Method 155 includes a step 159 of forming a device layer structure on the III-nitride semiconductor layer, wherein the device layer structure includes an indium gallium nitride layer that has a metal polar surface proximate to the nitrogen polar surface of the III-nitride semiconductor layer.

In some embodiments, method 155 includes a step of removing a portion of the III-nitride semiconductor layer to reduce the defect density proximate to the non-metal polar surface. In some embodiments, method 155 includes a step of reducing the surface roughness of the non-metal polar surface.

Method 155 can include many other steps. In some embodiments, step 156 includes forming the III-nitride semiconductor layer on a growth substrate so it has a metal polar surface proximate to the growth substrate. Step 156 can include a step of bonding the metal polar surface to the bonding substrate. Step 156 can include a step of removing the growth substrate so the III-nitride semiconductor layer is carried by the bonding substrate.

Figure 4C:
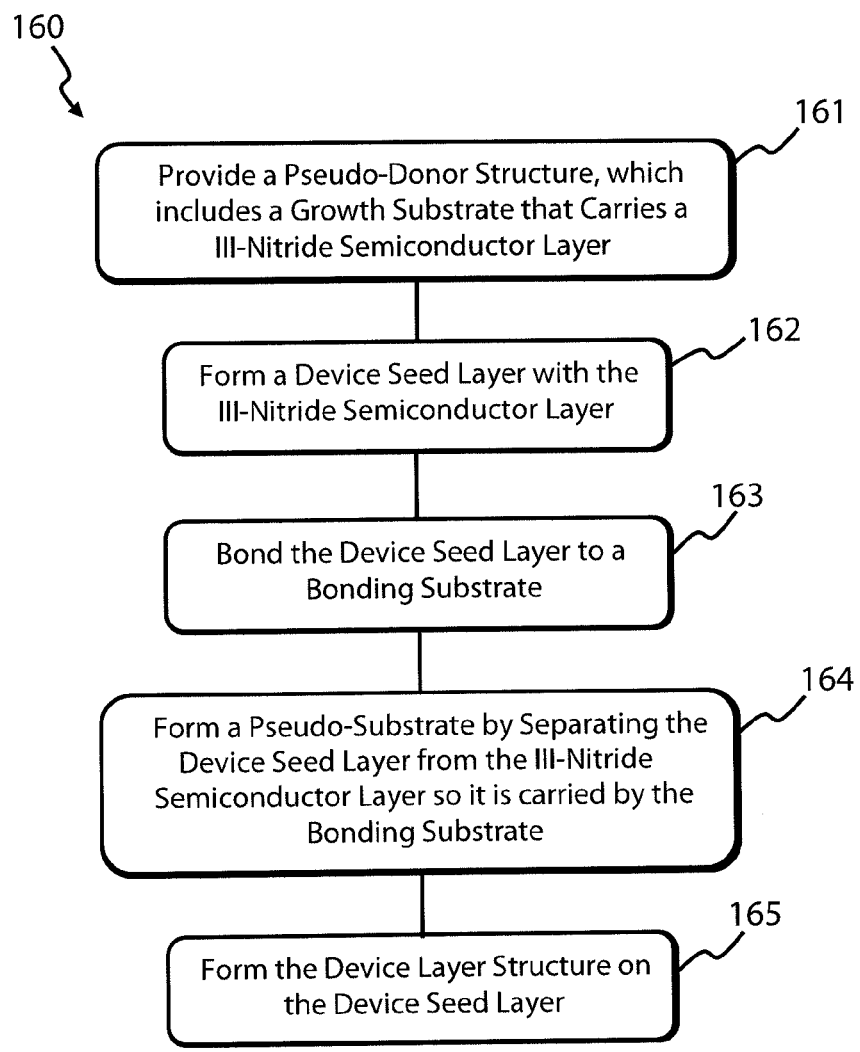

FIG. 4c is a flow diagram of a method 160, in accordance with the invention, of fabricating a device layer structure. In this embodiment, method 160 includes a step 161 of providing a pseudo-donor structure, which includes a growth substrate that carries a III-nitride semiconductor layer. Method 160 includes a step 162 of forming a seed layer with the III-nitride semiconductor layer. The seed layer is often formed by implanting a chemical species into the III-nitride semiconductor layer to form an implant layer.

Method 160 includes a step 163 of bonding the seed layer to a bonding substrate and a step 164 of forming a pseudo-substrate by separating the seed layer from the III-nitride semiconductor layer so it is carried by the bonding substrate. Method 160 includes a step 165 of forming the device layer structure on the seed layer, wherein the device layer structure includes an indium gallium nitride layer. In some embodiments, the indium gallium nitride layer has a metal polar surface proximate to the seed layer. In some embodiments, method 160 includes a step of replenishing the III-nitride semiconductor layer after the seed layer is separated from it. In some embodiments, multiple pseudo-substrates are formed by separating multiple seed layers from the III-nitride semiconductor layer.

While particular embodiments of the invention have been shown and described, numerous variations and alternative embodiments will occur to those skilled in the art. Accordingly, it is intended that the invention be limited only in terms of the appended claims.

The invention claimed is:

1. A method of fabricating a device layer structure, comprising:
providing a gallium nitride semiconductor layer carried by a growth substrate, wherein the gallium nitride semiconductor layer has a gallium polar surface and a nitrogen polar surface closer to the growth substrate than the gallium polar surface;
bonding the gallium nitride semiconductor layer to a first bonding substrate, wherein the gallium nitride semiconductor layer has the gallium polar surface closer to the first bonding substrate than the nitrogen polar surface;
removing the growth substrate such that the gallium nitride semiconductor layer is carried by the first bonding substrate; and
growing at least a portion of a device layer structure comprising an indium gallium nitride material on the nitrogen polar surface of the gallium nitride semiconductor layer after removing the growth substrate such that the indium gallium nitride material is a nitrogen polar grown InGaN material, the indium gallium nitride material including a nitrogen polar exposed surface on a side thereof opposite the gallium nitride semiconductor layer;
wherein the nitrogen polar grown InGaN material includes a light-emitting region, the device layer structure comprising a single layer of the indium gallium nitride material grown pseudomorphically below a critical thickness of the single layer of the indium gallium nitride material on the gallium nitride semiconductor layer.

2. The method of claim 1, wherein the indium gallium nitride material includes a metal polar surface adjacent to the nitrogen polar surface of the gallium nitride semiconductor layer.

3. The method of claim 1, wherein the gallium nitride semiconductor layer is a seed layer.

4. The method of claim 1, wherein a solubility of indium in the indium gallium nitride material is increased in response to growing the indium gallium nitride material on the nitrogen polar surface of the gallium nitride semiconductor layer relative to a solubility of indium in the indium gallium nitride material when grown on a metal polar surface of a gallium nitride semiconductor layer.

5. The method of claim 1, wherein sizes of pits in the exposed surface of the indium gallium nitride material are reduced in response to growing the indium gallium nitride material on the nitrogen polar surface of the gallium nitride semiconductor layer relative to sizes of pits in an exposed surface of the indium gallium nitride material when grown on a metal polar surface of a gallium nitride semiconductor layer.

6. The method of claim 1, wherein removing the growth substrate includes removing a portion of the gallium nitride semiconductor layer.

7. The method of claim 1, further including bonding the indium gallium nitride material to a second bonding substrate and removing the first bonding substrate from the gallium nitride semiconductor layer.

8. The method of claim 1, further including reducing the defect density of the gallium nitride semiconductor layer proximate to the nitrogen polar surface.

9. The method of claim 8, further including using at least one of wet and mechanical etching to reduce the defect density.

10. The method of claim 1, further comprising forming the indium gallium nitride material defining the light-emitting region of the device layer structure to comprise about 20% or more indium.

* * * * *